US012735791B2

(12) United States Patent
Sinha et al.

(10) Patent No.: US 12,735,791 B2
(45) Date of Patent: Sep. 15, 2026

(54) METHODS AND SYSTEMS FOR REAL-TIME OPTIMIZATION AND CONTROL OF SUBSTRATE IN MOTION CHEMICAL VAPOR DEPOSITION

(71) Applicant: Tata Consultancy Services Limited, Mumbai (IN)

(72) Inventors: Utkarsh Prateek Brajesh Sinha, Pune (IN); Balamurugan Deivendran, Pune (IN); Vishnu Swaroopji Masampally, Hyderabad (IN); Venkataramana Runkana, Pune (IN)

(73) Assignee: Tata Consultancy Services Limited, Mumbai (IN)

( * ) Notice: Subject to any disclaimer, the term of this patent is extended or adjusted under 35 U.S.C. 154(b) by 0 days.

(21) Appl. No.: 18/975,774

(22) Filed: Dec. 10, 2024

(65) Prior Publication Data

US 2025/0188616 A1 Jun. 12, 2025

(30) Foreign Application Priority Data

Dec. 11, 2023 (IN) ............................. 202321084442

(51) Int. Cl.

| | |
|---|---|
| ***C23C 16/52*** | (2006.01) |
| ***C23C 16/40*** | (2006.01) |
| ***C23C 16/458*** | (2006.01) |

(52) U.S. Cl.
CPC ............ *C23C 16/52* (2013.01); *C23C 16/405* (2013.01); *C23C 16/4584* (2013.01)

(58) Field of Classification Search
CPC . C23C 16/52; C23C 16/45502; C23C 16/542; G06F 30/27; G06F 2119/18;

(Continued)

(56) References Cited

U.S. PATENT DOCUMENTS

| | | | | |
|---|---|---|---|---|
| 9,499,906 | B2 | 11/2016 | Sieber et al. | |
| 2007/0090091 | A1 * | 4/2007 | Adomaitis | ............ C23C 14/542 700/121 |
| 2021/0371980 | A1 | 12/2021 | Pimputkar | |

FOREIGN PATENT DOCUMENTS

| | | | |
|---|---|---|---|
| WO | 2022243891 | A1 | 11/2022 |

OTHER PUBLICATIONS

Kwok, King Hong et al., "Laser-induced carbon CVD on a moving fused quartz substrate: morphological and oscillatory deposition characteristics", Date: Sep. 3, 2003, pp. 2307-2316, volume-issue Nos. vol. 41, Issue 12, Publisher: Elsevier B.V, Link:https://www.sciencedirect.com/science/article/abs/pii/S0008622303002859.

* cited by examiner

*Primary Examiner* — Tabassom Tadayyon Eslami
(74) *Attorney, Agent, or Firm* — Finnegan, Henderson, Farabow, Garrett & Dunner, LLP

(57) ABSTRACT

There is a challenge with limited quantitative yield and uniformity of film being deposited by a chemical vapor deposition (CVD) process. The present disclosure provide methods and systems for real-time optimization and control of substrate in motion CVD. In the present disclosure, solution for improving KPIs of chemical vapor deposition process of transition metal dichalcogenides (TMDs) in a horizontal CVD reactor is provided. A provision of substrates in motion CVD reactor is provided that makes substrate to reciprocate, rotate, revolve, or oscillate in horizontal and vertical direction to improve deposition rates. The present disclosure increases deposition rate by providing more surface area to precursors flowing into the CVD reactor. An effect of process parameters is investigated using computational fluid dynamics (CFD), machine learning and optimization process. This leads to optimization of the CVD (Continued)

reactor and optimized recommendation settings for the CVD reactor are obtained.

6 Claims, 8 Drawing Sheets

(58) Field of Classification Search
CPC ....... G06F 30/28; G05B 13/048; H10P 74/00; H10P 74/203
See application file for complete search history.

FIG. 2

METHODS AND SYSTEMS FOR REAL-TIME OPTIMIZATION AND CONTROL OF SUBSTRATE IN MOTION CHEMICAL VAPOR DEPOSITION

PRIORITY CLAIM

This U.S. patent application claims priority under 35 U.S.C. § 119 to: Indian Patent Application No. 202321084442, filed on 11 Dec. 2023. The entire contents of the aforementioned application are incorporated herein by reference.

TECHNICAL FIELD

The disclosure herein generally relates to the field of chemical vapor deposition, and, more particularly, to methods and systems for real-time optimization and control of substrate in motion chemical vapor deposition.

BACKGROUND

Two-dimensional (2D) layered materials ranging from zero bandgap graphene to wide bandgap insulators such as boron nitride offer new opportunities in the field of nano-electronics with its rich variation of physical properties. Although graphene has been most widely studied 2D material, its lack of a bandgap and the resulting leakage current of graphene transistors severely limits its use. 2D layered materials such as transition metal dichalcogenides (TMDs) provide a solution to this dilemma as most TMDs have a finite bandgap while retaining the ideal qualities of ultrathin 2D materials. TMD is usually deposited by horizontal cold wall chemical vapor deposition (CVD) reactor.

Chemical vapor deposition (CVD) is a process of depositing a compound on a substrate, by a series of gas phase reactions and surface reactions occurring near the substrate. The horizontal CVD reactors are one type of configurations leading to better deposition rate with precursors flowing from bottom and upstream of the CVD reactor. However, with minute change in process conditions affecting KPIs such as deposition rate and uniformity index of the film deposited, it is difficult to control the deposition process. Traditionally, the CVD processes also led to deposition occurring on the wall of the reactor than the substrates affecting the quantitative yield of the film on the substrate. Further, presence of a static substrate inside the CVD reactor results in excessive recirculation loops around the substrate which are detrimental to film quality and yield.

SUMMARY

Embodiments of the present disclosure present technological improvements as solutions to one or more of the above-mentioned technical problems recognized by the inventors in conventional systems. For example, in one embodiment, a processor implemented chemical vapor deposition method on a substrate is provided. The processor implemented chemical vapor deposition method, comprising: providing, via one or more hardware processors, a chemical vapor deposition (CVD) reactor that includes one or more crucibles and a plurality of inlets through which a plurality of inputs are fed at corresponding specific flow rates and corresponding specific temperatures; providing, via the one or more hardware processors, a substrate positioned at a specific location inside the CVD reactor that is given a reciprocating motion as per at least one of (i) a design frequency, and (ii) a design amplitude; optimizing, via the one or more hardware processors, the motion of the substrate online, wherein the step of optimizing is performed by: determining Design of Experiments (DoE) by (i) identifying a set of input variables and a set of target variables, (ii) specifying and testing a plurality of assumptions, and (iii) specifying one or more objectives that includes a range of values for each input variable from the set of input variables; determining a simulated value of each target variable from the set of target variables to obtain a set of simulated target variables by performing Computational Fluid Dynamics (CFD) modelling on the DoE, wherein the CFD modelling is performed by (i) setting up geometry and mesh for a CVD reactor design, and (ii) identifying a simulation setup and a plurality of models, (iii) performing one or more simulations the DoE, and (iv) exporting a plurality of simulation data; identifying a set of important variables from the set of simulated variables; training a set of data-based models using the set of simulated target variables and the set of important variables; identifying a best data-model from the set of data-based models based on accuracy of prediction of the set of target variables; identifying a plurality of optimization objectives, a plurality of constraints and a range of values for each input variable from the set of input variables and each target variable from the set of target variables; and performing a multi-objective optimization on (i) the plurality of optimization objectives, (ii) the plurality of constraints, (iii) the range of values for each input variable from the set of input variables and each target variable from the set of target variables, and (iv) the best data-based model to obtain a set of optimal operating conditions; operating, via the one or more hardware processors, the substrate in motion CVD reactor at a specific operating condition from the set of optimal operating conditions for a specific amount of time by depositing a film on the substrate using the plurality of inputs by maintaining one or more walls of the CVD reactor at a specific temperature; and extracting, via one or more hardware processors, the substrate with the deposited film from the CVD reactor, wherein the extracted substrate with the deposited film is examined for measuring one or more quality parameters and post processed.

In another aspect, a system is provided. The system comprising a CVD reactor (102) that includes one or more crucibles and a plurality of inlets through which a plurality of inputs are fed at corresponding specific flow rates and corresponding specific temperatures; one or more Input/Output (I/O) interfaces (106); a memory (108) storing instructions; and one or more hardware processors (104) coupled to the memory (108) via the one or more I/O interfaces (106), wherein the one or more hardware processors (104) are configured by the instructions to: provide a substrate positioned at a specific location inside the CVD reactor that is given a reciprocating motion as per at least one of (i) a design frequency, and (ii) a design amplitude; optimize the motion of the substrate online, wherein the step of optimization is performed by: determining Design of Experiments (DoE) by (i) identifying a set of input variables and a set of target variables, (ii) specifying and testing a plurality of assumptions, and (iii) specifying one or more objectives that includes a range of values for each input variable from the set of input variables; determining, a simulated value of each target variable from the set of target variables to obtain a set of simulated target variables by performing Computational Fluid Dynamics (CFD) modelling on the DoE, wherein the CFD modelling is performed by (i) setting up geometry and mesh for a CVD reactor design, and (ii) identifying a simulation setup and a plurality of models, (iii) performing one or more simulations on the DoE, and (iv) exporting a plurality of simulation data; identifying, a set of important variables from the set of simulated variables; training a set of data-based models using the set of simulated target variables and the set of important variables; identifying a best data-model from the set of data-based models based on accuracy of prediction of the set of target variables; identifying a plurality of optimization objectives, a plurality of constraints and a range of values for each input variable from the set of input variables and each target variable from the set of target variables; and performing a multi-objective optimization on (i) the plurality of optimization objectives, (ii) the plurality of constraints, (iii) the range of values for each input variable from the set of input variables and each target variable from the set of target variables, and (iv) the best data-based model to obtain a set of optimal operating conditions; operate the substrate CVD reactor at a specific operating condition from the set of optimal operating conditions for a specific amount of time by depositing a film on the substrate using the plurality of inputs by maintaining one or more walls of the CVD reactor at a specific temperature; and extract the substrate with the deposited film from the CVD reactor, wherein the extracted substrate with the deposited film is examined for measuring one or more quality parameters and post processed.

In yet another aspect, a non-transitory computer readable medium is provided. The non-transitory computer readable medium are configured by instructions for providing a chemical vapor deposition (CVD) reactor that includes one or more crucibles and a plurality of inlets through which a plurality of inputs are fed at corresponding specific flow rates and corresponding specific temperatures; providing a substrate positioned at a specific location inside the CVD reactor that is given a reciprocating motion as per at least one of (i) a design frequency, and (ii) a design amplitude; optimizing the motion of the substrate online, wherein the step of optimizing is performed by: determining Design of Experiments (DoE) by (i) identifying a set of input variables and a set of target variables, (ii) specifying and testing a plurality of assumptions, and (iii) specifying one or more objectives that includes a range of values for each input variable from the set of input variables; determining a simulated value of each target variable from the set of target variables to obtain a set of simulated target variables by performing Computational Fluid Dynamics (CFD) modelling on the DoE, wherein the CFD modelling is performed by (i) setting up geometry and mesh for a CVD reactor design, and (ii) identifying a simulation setup and a plurality of models, (iii) performing one or more simulations the DoE, and (iv) exporting a plurality of simulation data; identifying a set of important variables from the set of simulated variables; training a set of data-based models using the set of simulated target variables and the set of important variables; identifying a best data-model from the set of data-based models based on accuracy of prediction of the set of target variables; identifying a plurality of optimization objectives, a plurality of constraints and a range of values for each input variable from the set of input variables and each target variable from the set of target variables; and performing a multi-objective optimization on (i) the plurality of optimization objectives, (ii) the plurality of constraints, (iii) the range of values for each input variable from the set of input variables and each target variable from the set of target variables, and (iv) the best data-based model to obtain a set of optimal operating conditions; operating the substrate in motion CVD reactor at a specific operating condition from the set of optimal operating conditions for a specific amount of time by depositing a film on the substrate using the plurality of inputs by maintaining one or more walls of the CVD reactor at a specific temperature; and extracting, the substrate with the deposited film from the CVD reactor, wherein the extracted substrate with the deposited film is examined for measuring one or more quality parameters and post processed.

In accordance with an embodiment of the present disclosure, the specific operating condition from the set of optimal operating conditions depends on a reaction chemistry and size of the CVD reactor.

In accordance with an embodiment of the present disclosure, one or more quality parameters comprise a fill thickness and a uniformity index.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this disclosure, illustrate exemplary embodiments and, together with the description, serve to explain the disclosed principles:

FIG. 2 illustrates an exemplary flow diagram illustrating a method for real-time optimization and control of substrate in motion chemical vapor deposition, in accordance with some embodiments of the present disclosure.

DETAILED DESCRIPTION

Figure 1:
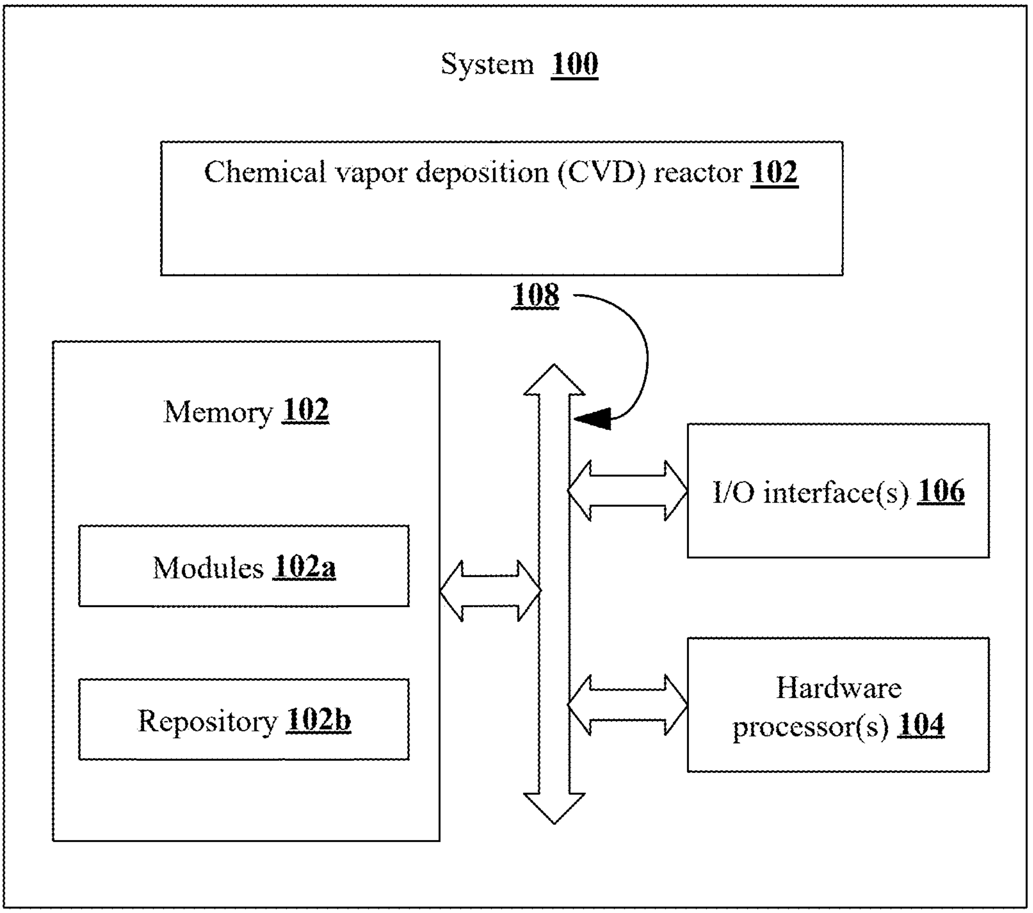
FIG. 1 illustrates a block diagram of a system implementing a chemical vapor deposition (CVD) reactor for real-time optimization and control of substrate in motion chemical vapor deposition, in accordance with an embodiment of present disclosure.

Exemplary embodiments are described with reference to the accompanying drawings. In the figures, the left-most digit(s) of a reference number identifies the figure in which the reference number first appears. Wherever convenient, the same reference numbers are used throughout the drawings to refer to the same or like parts. While examples and features of disclosed principles are described herein, modifications, adaptations, and other implementations are possible without departing from the scope of the disclosed embodiments. It is intended that the following detailed description be considered as exemplary only, with the true scope being indicated by the following embodiments described herein.

Two-dimensional (2D) materials have attained great attention in the recent past because of their attractive chemical and physical properties. Graphene, the most common 2D material, is thin, has excellent mechanical, physical and conducting properties because of its unique bonding and subsequently band gap characteristics, having electronic carriers act as Dirac-Fermions. However, graphene has a zero bandgap which makes it difficult for its use in many applications of electronic devices. Alternately, 2D transition metal dichalcogenides (TMDs) have attained popularity in the field of storage conversion, electronic industries because of its attractive electric, magnetic, mechanical, optical properties and their sizeable bandgap. TMDs have recently attracted ever growing attraction because they are the promising material for new generation electric devices due to their inert surfaces and thickness dependent electrical and optical properties. TMDs are usually deposited by horizontal cold wall chemical vapor deposition reactor. In the CVD (Chemical Vapor Deposition) process, the thin film is deposited on a hot substrate with metal precursor placed just proximity to the substrate and other precursor placed at a distance with inert gas flowing upstream. The morphology of film deposited and microstructure of TMDs is a function of CVD reactor conditions. Several efforts have been made in the past to analogize the growth structure, morphology, and kinetics of TMDs with reactor conditions. The existence of synergies between process conditions, transport phenomena and reaction kinetics in the CVD reactor contribute to the uniformity and deposition rate of film. Therefore, it is essential to closely observe the transport phenomena in the reactor to understand the effects of process parameters on deposition rate and uniformity.

2D TMDs materials can be synthesized by laser thinning, liquid exfoliation, chemical vapor deposition and other methods. Of all these methods, CVD has been proven for producing mass amount of monolayered crystals required into consumer application. Film produced by mechanical exfoliation techniques tends to render high quality films but have exceptionally low yield. The CVD process is advantageous over other methods because of its low cost, high yield, mono and multilayer production based on the process conditions involved. Many times, growth of film in a CVD reactor is a function of process conditions such as pressure, temperature, chemical kinetics, inlet flowrates and transport phenomena near the substrate. With subtle change in process conditions of CVD reactor yielding different forms of film shape and size, it is difficult to reproduce, extend it to different dimensions across different laboratories. Therefore, a deeper understanding of transport phenomena, physics, process parameters and their effect on key performance indicators such as deposition rate and uniformity index is essential. Various type of configurations of CVD reactors exists such as hot wall, cold wall, horizontal, vertical, high-pressure, low-pressure reactors, and/or the like. However, horizontal cold wall reactor configurations are always preferred for depositing 2D TMDs. Conventional methods suffer from the problem of limited quantitative yield and uniformity of film being deposited by the CVD process.

The present disclosure addresses the unresolved problems of the conventional method by provision of in motion substrates in the CVD reactor. Embodiments of the present disclosure provide methods and systems for real-time optimization and control of substrate in motion chemical vapor deposition. In the present disclosure, $MoS_2$ (Molybdenum Disulfide) is chosen as an example of 2D TMDs and yield of synthesis of $MoS_2$ is improved by introducing a motion to the substrate in the CVD reactor and investigating the effects of process parameters using computational fluid dynamics (CFD), machine learning and optimization process. The method of the present disclosure aims to build a comprehensive CFD model establishing the transport phenomena, and the effect of operating parameters such as operating temperature, operating pressure, flowrates etc. on deposition rate and uniformity index.

Referring now to the drawings, and more particularly to FIGS. 1 through 7, where similar reference characters denote corresponding features consistently throughout the figures, there are shown preferred embodiments and these embodiments are described in the context of the following exemplary system and/or method.

FIG. 1 illustrates a block diagram of a system 100 implementing a chemical vapor deposition (CVD) reactor 102 for real-time optimization and control of substrate in motion chemical vapor deposition, in accordance with an embodiment of present disclosure.

In an embodiment, the system 100 includes or is otherwise in communication with a CVD reactor 102, one or more hardware processors 104, communication interface device(s) or input/output (I/O) interface(s) 106, and one or more data storage devices or memory 108 operatively coupled to the one or more hardware processors 104. The one or more hardware processors 104, the memory 108, and the I/O interface(s) 106 may be coupled to a system bus or a similar mechanism.

The I/O interface(s) 106 may include a variety of software and hardware interfaces, for example, a web interface, a graphical user interface, and the like. The I/O interface(s) 106 may include a variety of software and hardware interfaces, for example, interfaces for peripheral device(s), such as a keyboard, a mouse, an external memory, a plurality of sensor devices, a printer and the like. Further, the I/O interface(s) 106 may enable the system 100 to communicate with other devices, such as web servers and external databases.

The I/O interface(s) 106 can facilitate multiple communications within a wide variety of networks and protocol types, including wired networks, for example, local area network (LAN), cable, etc., and wireless networks, such as Wireless LAN (WLAN), cellular, or satellite. For the purpose, the I/O interface(s) 106 may include one or more ports for connecting a number of computing systems with one another or to another server computer. Further, the I/O interface(s) 106 may include one or more ports for connecting a number of devices to one another or to another server.

The one or more hardware processors 104 may be implemented as one or more microprocessors, microcomputers, microcontrollers, digital signal processors, central processing units, state machines, logic circuitries, and/or any devices that manipulate signals based on operational instructions. Among other capabilities, the one or more hardware processors 104 are configured to fetch and execute computer-readable instructions stored in the memory 108. In the context of the present disclosure, the expressions 'processors' and 'hardware processors' may be used interchangeably. In an embodiment, the system 100 can be implemented in a variety of computing systems, such as laptop computers, portable computer, notebooks, hand-held devices, workstations, mainframe computers, servers, a network cloud and the like.

The memory 108 may include any computer-readable medium known in the art including, for example, volatile memory, such as static random access memory (SRAM) and dynamic random access memory (DRAM), and/or non-volatile memory, such as read only memory (ROM), erasable programmable ROM, flash memories, hard disks, optical disks, and magnetic tapes. In an embodiment, the memory 108 includes a plurality of modules 108*a* and a repository 108*b* for storing data processed, received, and generated by one or more of the plurality of modules 108*a*. The plurality of modules 108*a* may include routines, programs, objects, components, data structures, and so on, which perform particular tasks or implement particular abstract data types.

The plurality of modules 108*a* may include programs or computer-readable instructions or coded instructions that supplement applications or functions performed by the system 100. The plurality of modules 108*a* may also be used as, signal processor(s), state machine(s), logic circuitries, and/or any other device or component that manipulates signals based on operational instructions. Further, the plurality of modules 108*a* can be used by hardware, by computer-readable instructions executed by the one or more hardware processors 104, or by a combination thereof. Further, the memory 108 may include information pertaining to input(s)/output(s) of each step performed by the processor(s) 104 of the system 100 and methods of the present disclosure.

The repository 108*b* may include a database or a data engine. Further, the repository 108*b* amongst other things, may serve as a database or includes a plurality of databases for storing the data that is processed, received, or generated as a result of the execution of the plurality of modules 108*a*. Although the repository 108*b* is shown internal to the system 100, it will be noted that, in alternate embodiments, the repository 108*b* can also be implemented external to the system 100, where the repository 108*b* may be stored within an external database (not shown in FIG. 1) communicatively coupled to the system 100. The data contained within such external database may be periodically updated. For example, new data may be added into the external database and/or existing data may be modified and/or non-useful data may be deleted from the external database. In one example, the data may be stored in an external system, such as a Lightweight Directory Access Protocol (LDAP) directory and a Relational Database Management System (RDBMS). In another embodiment, the data stored in the repository 108*b* may be distributed between the system 100 and the external database.

Figure 2:
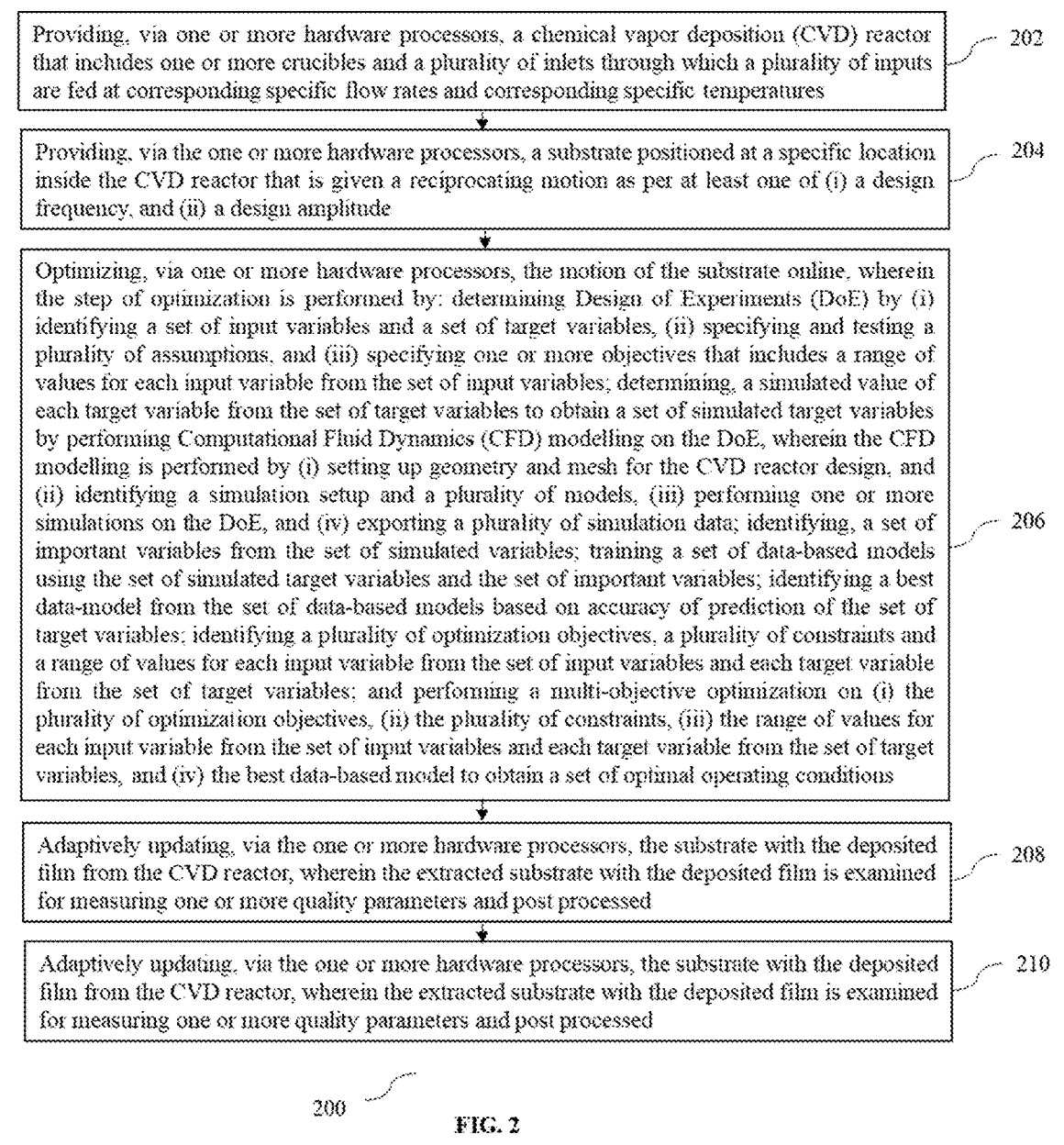

FIG. 2, with reference to FIG. 1, is an exemplary flow diagram illustrating a method 200 for real-time optimization and control of substrate in motion chemical vapor deposition, using the system 100 of FIG. 1, in accordance with an embodiment of the present disclosure.

Referring to FIG. 2, in an embodiment, the system 100 comprises one or more data storage devices or the memory 108 operatively coupled to the one or more hardware processors 104 and is configured to store instructions for execution of steps of the method by the one or more processors 104. The steps of the method 200 of the present disclosure will now be explained with reference to components of the system 100 of FIG. 1, the flow diagram as depicted in FIG. 2 and one or more examples. Although steps of the method 200 including process steps, method steps, techniques or the like may be described in a sequential order, such processes, methods, and techniques may be configured to work in alternate orders. In other words, any sequence or order of steps that may be described does not necessarily indicate a requirement that the steps be performed in that order. The steps of processes described herein may be performed in any practical order. Further, some steps may be performed simultaneously, or some steps may be performed alone or independently.

Figure 3:
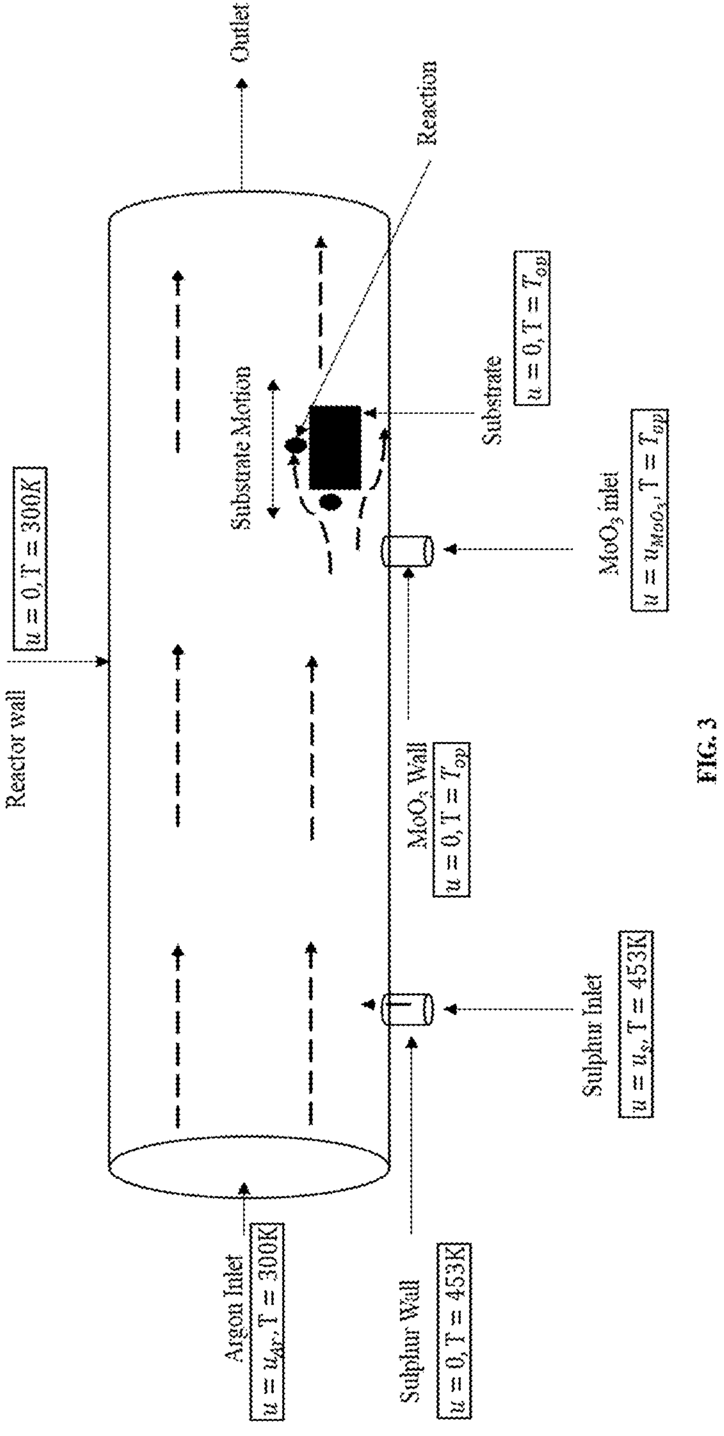
FIG. 3 is a detailed functional diagram of the CVD reactor implemented by the system of FIG. 1 for real-time optimization and control of substrate in motion chemical vapor deposition according to some embodiments of the present disclosure.

In an embodiment, at step 202 of the present disclosure, the one or more hardware processors 204 are configured to provide a chemical vapor deposition (CVD) reactor that includes one or more crucibles and a plurality of inlets through which a plurality of inputs are fed at corresponding specific flow rates and corresponding specific temperatures. In an embodiment, the plurality of inputs may comprise but are not limited to a carrier gas obtained from a carrier gas storage, a plurality of precursors as vapors, and/or the like. The corresponding specific flow rates depend on diameter of the CVD reactor and reaction chemistry of the product. FIG. 3 is a detailed functional diagram of the CVD reactor implemented by the system 100 of FIG. 1 for real-time optimization and control of substrate in motion chemical vapor deposition according to some embodiments of the present disclosure. As shown in FIG. 3, there are three inlets and one outlet in the reactor. The length of the reactor is 420 mm, and the diameter of the reactor is 80 mm.

In an embodiment, at step 204 of the present disclosure, the one or more hardware processors 204 are configured to provide a substrate positioned at a specific location inside the CVD reactor that is given a reciprocating motion as per at least one of (i) a design frequency, and (ii) a design amplitude. As shown in FIG. 3, the dimensions of the substrate are 20 mm*10 mm*10 mm with Molybdenum trioxide ($MoO_3$) inlet placed 10 mm from the substrate and sulfur inlet placed 240 mm from the substrate. Argon which is carrier gas enters from upstream of the reactor while $MoO_3$ and sulfur which are the precursors enter from their inlets, respectively. The substrate and $MoO_3$ inlets are maintained at an operating temperature $T_{op}$, sulfur at the inlet is preheated and is maintained at 453.0K, while rest of the CVD reactor is maintained at ambient making it a cold wall reactor. The substrate is reciprocated axially in the direction of inlet to outlet and vice versa at the design frequency of 0 to 25 revolution per second. The reactants enter the reactor and diffuse near the substrate. The diffused reactants are then exposed to contours of temperature gradient near the substrate leading to deposition on the substrate of the reactor.

In an embodiment, at step 206 of the present disclosure, the one or more hardware processors 104 are configured to optimize motion of the substrate online. For performing the step of optimization, Design of Experiments (DoE) are determined by (i) identifying a set of input variables and a set of target variables, (ii) specifying and testing a plurality of assumptions, and (iii) specifying one or more objectives that includes a range of values for each input variable from the set of input variables. Further, a simulated value of each target variable from the set of target variables is determined to obtain a set of simulated target variables by performing Computational Fluid Dynamics (CFD) modelling on the DoE. The CFD modelling is performed by (i) setting up geometry and mesh for a CVD reactor design, (ii) identifying a simulation setup and a plurality of models, (iii) performing one or more simulations on the DoE, and (iv) exporting a plurality of simulation data. The set of simulated target variables may include but are not limited to deposition rate, Reynolds number, and/or the like. From the set of simulated variables, a set of important variables are identified. Further, a set of data-based models is trained using the set of simulated target variables and the set of important variables. Furthermore, a best data-model from the set of data-based models is identified based on accuracy of prediction of the set of target variables. After identifying the best data-model, a plurality of optimization objectives, a plurality of constraints and a range of values for each input variable from the set of input variables and each target variable from the set of target variables. Further, a multi-objective optimization is performed on (i) the plurality of optimization objectives, (ii) the plurality of constraints, (iii) the range of values for each input variable from the set of input variables and each target variable from the set of target variables, and (iv) the best data-based model to obtain a set of optimal operating conditions.

The step 206 is further illustrated and better understood by way of following exemplary explanation.

A design of experiment was generated for six input variables namely operating temperature, operating pressure, argon flowrate, weight of $MoO_3$, weight of Sulphur and the frequency of the substrate motion. The target variables are the deposition rate and uniformity index. Among various DoE algorithms, Latin hypercube sampling method is assumed to be the best method for DoE. It is assumed that the six input variables alone are affecting the target variables. The range of values for input variables are obtained by estimating minimum and maximum values of input variables available in an experimental data. Several partial differential equations involving mass, momentum, energy, and species transport are evaluated numerically utilizing the finite volume method assuming a continuum approach. A simplified kinetic reaction is chosen to represent the deposition process. The equations governing the modeling of the CVD reactors are expressed in the conservation of mass, momentum, energy, and species transport. The flow is assumed to be a laminar, continuum, and ideal compressible gas. No-slip ($u_{wall}$=0), impermeable boundary conditions are ensured on the solid wall surfaces, and surface reactions are strictly ensured on the substrate. Velocity inlet and pressure outlet are maintained at inlets and outlet of the reactor.

Commercial software Ansys® is used to model unsteady state CVD reactor. The CVD reactor is built in Ansys Design Modeler and meshed by Ansys Mesh generator. The meshed geometry is then translated to Ansys® Fluent® and corresponding boundary conditions are imposed on inlets, outlets, walls, and substrate of the reactor. The equations governing the modeling of the CVD reactors (also referred as (known governing equations) are discretized using a finite volume method by Ansys® Fluent®. The known governing equations are converted to algebraic set of equations by finite volume second order upwind scheme for advection terms, while second order central difference schemes for diffusion terms and a known COUPLED algorithm are used for pressure velocity equation. An iterative gauss seidel method is used to solve a set of linear equations. A grid independence study is conducted, and it is found that, a change in less than two is observed in Reynolds number, point velocity and temperature of the substrate when the number of cells were changed from 42623 cells to 179826 cells. Hence, a tradeoff between simulation accuracy and computational cost is chosen to decide to grid number. A convergence criterion of $10^{-6}$ was chosen to check the residuals of continuity, energy, momentum, and species conservation equations. Separate monitors such as deposition rate, temperature and velocity are set to find the convergence inside the reactor. Each simulation took an average of 20000 iterations to converge. Understanding transport phenomena with dimensionless numbers in the CVD reactor is widely used because of its detailed capture of transport process. Reynolds number (Re2) and Grashof (Gr) numbers are the two important dimensionless numbers used in analyzing flow phenomena of the CVD reactor. The ratio of the Grashof number and the Reynolds number ($Gr/Re^2$) measures a ratio of buoyance force over inertial force which helps in identifying the effect of circular temperature loops inside the cold wall CVD reactors and to identify a dominant flow inside the CVD reactor. At high $Gr/Re^2$, the natural convection was dominant over forced convection leading it to formation of circular loops which are considered detrimental for film growth. The plurality of simulation data comprises data of six input variables namely operating temperature, operating pressure, argon flowrate, weight of $MoO_3$, weight of Sulphur and frequency of the substrate used in the simulations. It further comprises outputs generated uniformity index, deposition rate and Reynolds number (Re2) and Grashof (Gr) numbers.

The set of important variables identified among the set of input variables are selected for building models. The set of important variables can be estimated using feature selection algorithms such as recursive feature elimination, and/or the like. The set of important variables can also be identified based on domain knowledge. In the context of the present disclosure, all six input variables identified as important variables to develop models for set of the target variables. The data of important variables from a simulation dataset used to develop models of the set of target variables using various machine learning or data-based algorithms. The data-based algorithms may include but are not limited to linear regression, support vector machines, random forest, Xgboost, adaboost, and/or the like. Accuracy of the models is estimated using various accuracy metrics such as mean squared error, root mean squared error, coefficient of regression, mean absolute error, mean absolute percentage error, and/or the like. The best data-based model from the set of data-based models developed using the data-based algorithms is selected for each target variable by comparing various accuracy metrics. XGboost model shows highest accuracy for both deposition rate and uniformity index models.

The uniformity index and the deposition rate are Key Performance Indicators (KPIs) in the CVD reactor and should be maximized for better performance. Therefore, the plurality of optimization objectives are identified to be maximizing the uniformity index and the deposition rate. In this case no constraints are applied. The set of input variables are considered as decision variables. Lower and upper bounds of the set of input variables are decided based on minimum and maximum values in the DoE data. Multi-objective optimization problem is solved using a non-dominated sorting based genetic algorithm (NSGA-II). The set of optimal operating conditions of input variables are obtained as solution using NSGA-II.

It is observed from the set of optimal operating conditions that the operating pressure should be high for operating the CVD reactor at high uniformity index and deposition rates. Higher pressures ensures flow from left to right at both ends of the CVD reactor and thereby inducing forced convection and removing natural recirculation. The set of optimal operating conditions suggest that temperature should be high for higher uniformity index and low for higher deposition rate. Higher temperatures results in sublimation of $MoO_3$ and thereby reducing amount of $MoO_3$ available for a reaction. This results in a reduced deposition rate due to lack of enough $MoO_3$ for the reaction. The argon flowrate should be high for higher deposition rates. The frequency of the substrate should be high for higher deposition rate and uniformity index. In an embodiment, at step 208 of the present disclosure, the one or more hardware processors 104 are configured to operate the substrate in motion CVD reactor at a specific operating condition from the set of optimal operating conditions for a specific amount of time by depositing a film on the substrate using the plurality of inputs by maintaining one or more walls of the CVD reactor at a specific temperature. The specific operating condition from the set of optimal operating conditions depends on a reaction chemistry and size of the CVD reactor.

Further, at step 210 of the present disclosure, the one or more hardware processors 204 are configured to extract the substrate with the deposited film from the CVD reactor. The extracted substrate with the deposited film is examined for measuring one or more quality parameters and post processed. The one or more quality parameters comprise a fill thickness and a uniformity index.

Experimental Results

Figure 4:
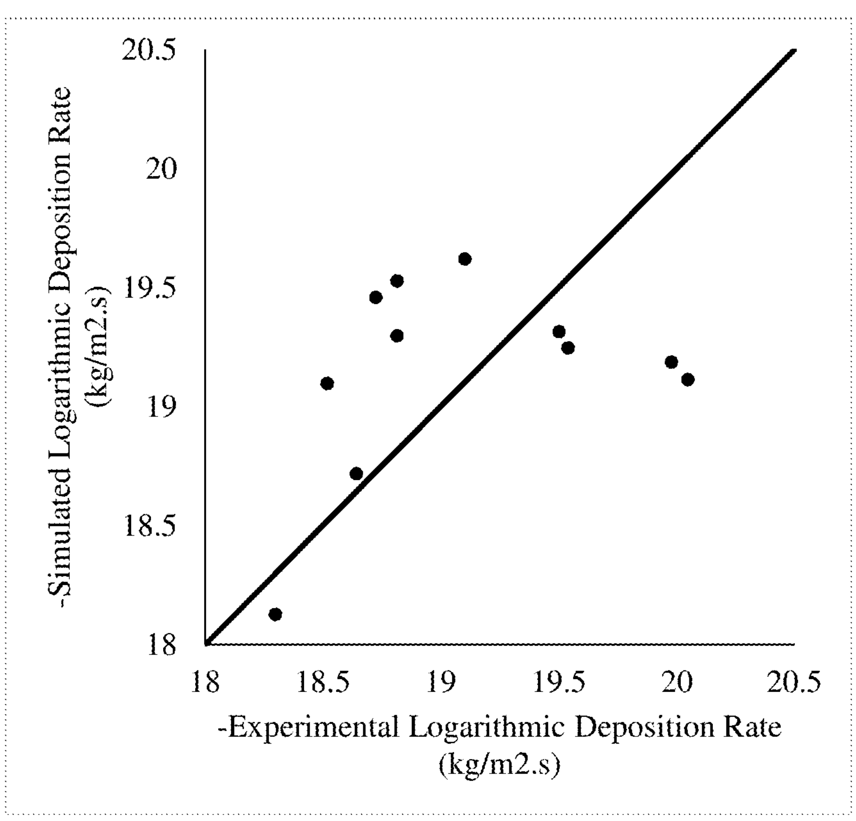
FIG. 4 depict graphical representations illustrating a comparison of experimental deposition rate and simulated deposition rate of the CVD reactor, in accordance with some embodiments of the present disclosure.

FIG. 4 depict graphical representations illustrating a comparison of experimental deposition rate and simulated deposition rate of the CVD reactor, in accordance with some embodiments of the present disclosure.

The validation of the CVD reactor has been done by collecting various experimental data. The data such as concentration of sulphur, concentration of $MoO_3$, thickness of film, processing time, substrate temperature, pressure of the reactor was collected for different experiments, where all the experiments were carried out at atmospheric pressure and Argon as carrier flow gas. The obtained data was imposed as boundary and operating conditions of the CVD reactor in simulations and corresponding deposition rate was obtained and compared with the experimental data. Conventionally, the CVD reactor was tuned and validated by reaction kinetics, as the kinetic reaction pathway contributes a major sum in determining the deposition rate. In the resent disclosure, since hydrodynamics is a major concern, a simplified kinetic pathway has been chosen, and kinetic parameters such as activation energy and pre-exponential factors have been tuned to determine the deposition rate. Sensitivity analyses were performed with the value of Activation energy and pre-exponential factor to compare and validate the deposition rate obtained in simulations and experimental data. The values of kinetic parameters, the pre-exponential factor ($k_0$) is 1.88568 and the activation energy is $2.154157e^{+0.7}$j/Kmol.

Figure 5:
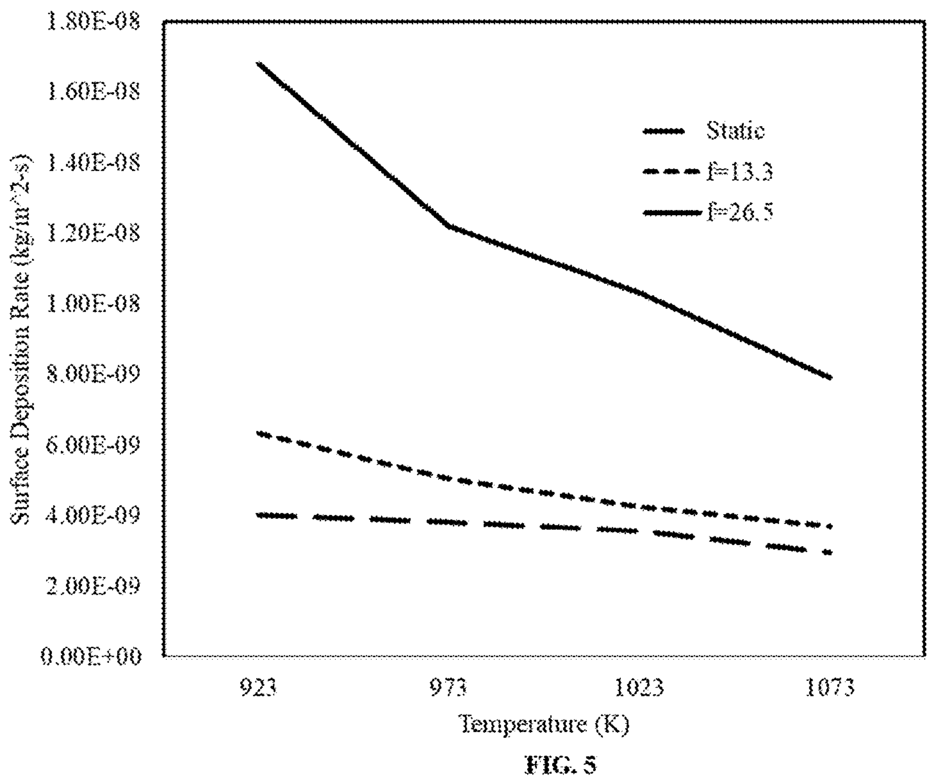
FIG. 5 depict graphical representations illustrating variation of deposition rate with temperature in accordance with some embodiments of the present disclosure.

FIG. 5 depict graphical representations illustrating variation of deposition rate with temperature, in accordance with some embodiments of the present disclosure. As shown in FIG. 5, the variation of deposition rate at 923 and 1073 K is represented keeping all the other parameters constant. The simulations were carried out in 2D reactor since three-dimensional (3D) simulations were computationally expensive for the static substrate itself. However validation of kinetics was done in 3D reactor for accuracy of validation. Increase in temperature decreases the deposition rate. It is observed that the increase in temperature of the substrate favors more amount of $MoO_3$ to sublime and reduces the amount of $MoO_3$ available for reaction to take place. This leads to decrease in deposition rate with increase in temperature for all individual substrate velocities. However, when the velocity is increased, the deposition rate increases at a constant temperature.

Figure 6:
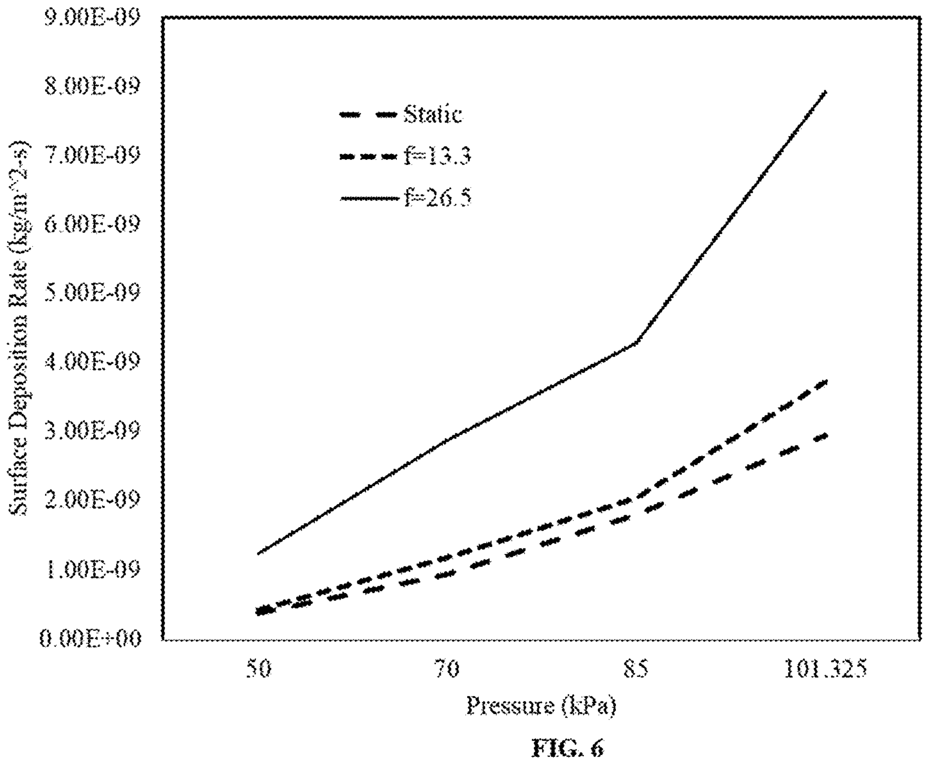
FIG. 6 depict graphical representations illustrating effect of pressure over the deposition rate, in accordance with some embodiments of the present disclosure.

FIG. 6 depict graphical representations illustrating effect of pressure over the deposition rate, in accordance with some embodiments of the present disclosure. As shown in FIG. 6, there is a linear decrease in deposition rate with decrease in pressure of the CVD reactor. The deposition rate dropped from $8.90e^{-0.9}$ kg/m2s at 101325 Pa to $1.2e^{-0.9}$ kg/m2s at 50000 Pa. There are three temperature gradients inside the reactor. The first is a temperature gradient from the sulfur inlet, second at the $MoO_3$ inlet and third at the substrate. Since there is temperature difference at all the three places, natural convection dominates in all the three places. However, at lower pressure, the forced circulation dominates the CVD reactor suppressing the recirculation caused by sulfur inlet, but since the temperature difference is huge around substrate, the natural convection dominates around the substrate making the reverse flow in the CVD reactor. Similarly, at higher pressures, the natural circulation dominates at both the substrate and sulfur inlet side making the flow dominated by natural convection, hence there is reverse flow in both the sides of the reactor. The effect of dimensionless numbers has been studied to identify the flow pattern inside the CVD reactor. Horizontal cold wall CVD reactors with heated substrates tend to have more natural recirculation caused by vortexes around the substrate because of the difference in temperature between the wall and the substrate. However, the presence of natural recirculation inside the CVD reactor traps the intermediate species affecting the deposition process. Hence, forced circulation is favored in cold wall horizontal reactors. To overcome these effects, the substrate was moved at 13 revolution per second (rps) and 26 rps. There is better increase in deposition rate when the substrate is moved.

Figure 7:
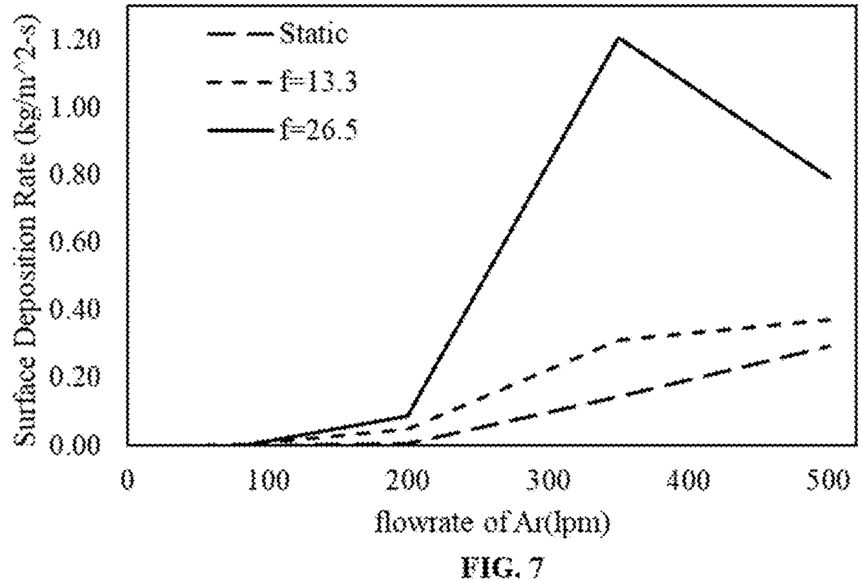
FIG. 7 depict graphical representations illustrating variation of deposition rate with argon flow rate in accordance with some embodiments of the present disclosure.

FIG. 7 depict graphical representations illustrating variation of deposition rate with argon flow rate in accordance with some embodiments of the present disclosure. Argon flow rates play a vital role in maintaining concentration gradient of reactants to the substrate. The inert gas in a CVD reactor is used to maintain a uniform concentration gradient axially throughout the CVD reactor till the point flow reaches the substrate. The variation of argon flowrate is shown in FIG. 7 keeping all the other parameters constant. As shown in FIG. 7, there is little increase in deposition rate for static substrate while for moving the substrate at higher velocities lead to higher deposition rate at higher flowrates.

Figure 8:
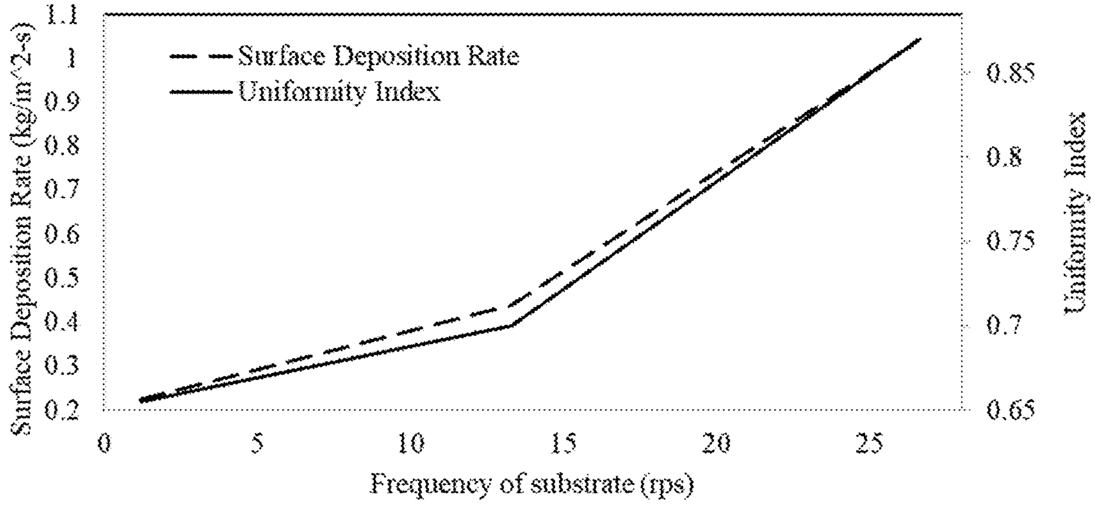
FIG. 8 depict graphical representations illustrating variation of deposition rate and uniformity index for variation in substrate velocity in accordance with some embodiments of the present disclosure.

FIG. 8 depict graphical representations illustrating variation of deposition rate and uniformity index for variation in substrate velocity in accordance with some embodiments of the present disclosure. Uniformity index is the other important parameter to consider for yield along with the deposition rate. The variation of velocity for deposition rate and uniformity index keeping all the other variables such as temperature, pressure, argon flowrate constant is shown in FIG. 8. The deposition rate and uniformity index increases with increase in substrate velocity indicating increased deposition rate and uniformity index at higher velocities.

The written description describes the subject matter herein to enable any person skilled in the art to make and use the embodiments. The scope of the subject matter embodiments is defined herein and may include other modifications that occur to those skilled in the art. Such other modifications are intended to be within the scope of the present disclosure if they have similar elements that do not differ from the literal language of the embodiments or if they include equivalent elements with insubstantial differences from the literal language of the embodiments described herein.

It is to be understood that the scope of the protection is extended to such a program and in addition to a computer-readable means having a message therein; such computer-readable storage means contain program-code means for implementation of one or more steps of the method, when the program runs on a server or mobile device or any suitable programmable device. The hardware device can be any kind of device which can be programmed including e.g. any kind of computer like a server or a personal computer, or the like, or any combination thereof. The device may also include means which could be e.g., hardware means like e.g. an application-specific integrated circuit (ASIC), a field-programmable gate array (FPGA), or a combination of hardware and software means, e.g. an ASIC and an FPGA, or at least one microprocessor and at least one memory with software processing components located therein. Thus, the means can include both hardware means and software means. The method embodiments described herein could be implemented in hardware and software. The device may also include software means. Alternatively, the embodiments may be implemented on different hardware devices, e.g. using a plurality of CPUs.

The embodiments herein can comprise hardware and software elements. The embodiments that are implemented in software include but are not limited to, firmware, resident software, microcode, etc. The functions performed by various components described herein may be implemented in other components or combinations of other components. For the purposes of this description, a computer-usable or computer readable medium can be any apparatus that can comprise, store, communicate, propagate, or transport the program for use by or in connection with the instruction execution system, apparatus, or device.

The illustrated steps are set out to explain the exemplary embodiments shown, and it should be anticipated that ongoing technological development will change the manner in which particular functions are performed. These examples are presented herein for purposes of illustration, and not limitation. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope of the disclosed embodiments. Also, the words “comprising,” “having,” “containing,” and “including,” and other similar forms are intended to be equivalent in meaning and be open ended in that an item or items following any one of these words is not meant to be an exhaustive listing of such item or items, or meant to be limited to only the listed item or items. It must also be noted that as used herein, the singular forms “a,” “an,” and “the” include plural references unless the context clearly dictates otherwise.

Furthermore, one or more computer-readable storage media may be utilized in implementing embodiments consistent with the present disclosure. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term “computer-readable medium” should be understood to include tangible items and exclude carrier waves and transient signals, i.e., be non-transitory. Examples include random access memory (RAM), read-only memory (ROM), volatile memory, nonvolatile memory, hard drives, CD ROMs, DVDs, flash drives, disks, and any other known physical storage media.

It is intended that the disclosure and examples be considered as exemplary only, with a true scope of disclosed embodiments being indicated herein by the following claims.

What is claimed is:

1. A method of real time optimization of motion of a substrate in a chemical vapor deposition (CVD) reactor, comprising:

providing, via one or more hardware processors, a chemical vapor deposition (CVD) reactor that includes one or more crucibles and a plurality of inlets through which a plurality of inputs are fed at corresponding specific flow rates and corresponding specific temperatures;

providing, via the one or more hardware processors, a substrate positioned at a specific location inside the CVD reactor that is given a reciprocating motion as per at least one of (i) a design frequency, and (ii) a design amplitude;

optimizing, via the one or more hardware processors, the motion of the substrate online, wherein the step of optimizing is performed by:

determining Design of Experiments (DoE) by (i) identifying a set of input variables and a set of target variables, (ii) specifying and testing a plurality of assumptions, and (iii) specifying one or more objectives that includes a range of values for each input variable from the set of input variables;

determining a simulated value of each target variable from the set of target variables to obtain a set of simulated target variables by performing Computational Fluid Dynamics (CFD) modelling on the DoE, wherein the CFD modelling is performed by (i) setting up geometry and mesh for a CVD reactor design, and (ii) identifying a simulation setup and a plurality of models, (iii) performing one or more simulations the DoE, and (iv) exporting a plurality of simulation data;

identifying a set of important variables from the set of simulated variables;

training a set of data-based models using the set of simulated target variables and the set of important variables;

identifying a best data-model from the set of data-based models based on accuracy of prediction of the set of target variables;

identifying a plurality of optimization objectives, a plurality of constraints and a range of values for each input variable from the set of input variables and each target variable from the set of target variables; and performing a multi-objective optimization on (i) the plurality of optimization objectives, (ii) the plurality of constraints, (iii) the range of values for each input variable from the set of input variables and each target variable from the set of target variables, and (iv) the best data-based model to obtain a set of optimal operating conditions;

operating, via the one or more hardware processors, the substrate in motion CVD reactor at a specific operating condition from the set of optimal operating conditions for a specific amount of time by depositing a film on the substrate using the plurality of inputs by maintaining one or more walls of the CVD reactor at a specific temperature; and extracting, via the one or more hardware processors, the substrate with the deposited film from the CVD reactor, wherein the extracted substrate with the deposited film is examined for measuring one or more quality parameters and post processed.

2. The processor implemented chemical vapor deposition method of claim 1, wherein the specific operating condition from the set of optimal operating conditions depends on a reaction chemistry and size of the CVD reactor.

3. The processor implemented chemical vapor deposition method of claim 1, wherein one or more quality parameters comprise a fill thickness and a uniformity index.

4. A system for real time optimization of motion of a substrate in a chemical vapor deposition (CVD) reactor, comprising:

a CVD reactor that includes one or more crucibles and a plurality of inlets through which a plurality of inputs are fed at corresponding specific flow rates and corresponding specific temperatures;

a memory storing instructions; and one or more hardware processors coupled to the memory via the one or more I/O interfaces, wherein the one or more hardware processors are configured by the instructions to:

provide a substrate positioned at a specific location inside the CVD reactor that is given a reciprocating motion as per at least one of (i) a design frequency, and (ii) a design amplitude;

optimize the motion of the substrate online, wherein the step of optimization is performed by:

determining Design of Experiments (DoE) by (i) identifying a set of input variables and a set of target variables, (ii) specifying and testing a plurality of assumptions, and (iii) specifying one or more objectives that includes a range of values for each input variable from the set of input variables;

determining, a simulated value of each target variable from the set of target variables to obtain a set of simulated target variables by performing Computational Fluid Dynamics (CFD) modelling on the DoE, wherein the CFD modelling is performed by (i) setting up geometry and mesh for a CVD reactor design, and (ii) identifying a simulation setup and a plurality of models, (iii) performing one or more simulations on the DoE, and (iv) exporting a plurality of simulation data;

identifying, a set of important variables from the set of simulated variables;

training a set of data-based models using the set of simulated target variables and the set of important variables;

identifying a best data-model from the set of data-based models based on accuracy of prediction of the set of target variables;

identifying a plurality of optimization objectives, a plurality of constraints and a range of values for each input variable from the set of input variables and each target variable from the set of target variables; and performing a multi-objective optimization on (i) the plurality of optimization objectives, (ii) the plurality of constraints, (iii) the range of values for each input variable from the set of input variables and each target variable from the set of target variables, and (iv) the best data-based model to obtain a set of optimal operating conditions;

operate the substrate CVD reactor at a specific operating condition from the set of optimal operating conditions for a specific amount of time by depositing a film on the substrate using the plurality of inputs by maintaining one or more walls of the CVD reactor at a specific temperature; and extract the substrate with the deposited film from the CVD reactor, wherein the extracted substrate with the deposited film is examined for measuring one or more quality parameters and post processed.

5. The system for implementing a chemical vapor deposition of substrate of claim 4, wherein the specific operating condition from the set of optimal operating conditions depends on a reaction chemistry and size of the CVD reactor.

6. The system for implementing a chemical vapor deposition of substrate of claim 4, wherein one or more quality parameters comprise a fill thickness and a uniformity index.

* * * * *